United States Patent
Stückler et al.

(10) Patent No.: US 7,230,311 B2
(45) Date of Patent: Jun. 12, 2007

(54) SILICON SUBSTRATE HAVING AN INSULATING LAYER

(75) Inventors: Ewald Stückler, Unterpremstatten (AT); Günther Koppitsch, Graz (AT)

(73) Assignee: Austriamicrosystems AG, Unterpremststten (AT)

( * ) Notice: Subject to any disclaimer, the term of this patent is extended or adjusted under 35 U.S.C. 154(b) by 64 days.

(21) Appl. No.: 10/498,206

(22) PCT Filed: Nov. 27, 2002

(86) PCT No.: PCT/EP02/13398

§ 371 (c)(1),
(2), (4) Date: Nov. 9, 2004

(87) PCT Pub. No.: WO03/054955

PCT Pub. Date: Jul. 3, 2003

(65) Prior Publication Data

US 2005/0051863 A1    Mar. 10, 2005

(30) Foreign Application Priority Data

Dec. 13, 2001 (DE) ............... 101 61 397
Dec. 21, 2001 (DE) ............... 101 63 460

(51) Int. Cl.
*H01L 29/00* (2006.01)
(52) U.S. Cl. ................................... 257/499
(58) Field of Classification Search ............ 438/96, 438/51, 20, 424; 257/499, 374, 288
See application file for complete search history.

(56) References Cited

U.S. PATENT DOCUMENTS

| 3,935,634 | A  | * | 2/1976 | Kurtz et al. ............ 438/51 |
| 6,093,599 | A  |   | 7/2000 | Lee et al. |
| 6,255,190 | B1 |   | 7/2001 | Kroner |
| 6,274,920 | B1 |   | 8/2001 | Park et al. |
| 6,515,319 | B2 | * | 2/2003 | Widmann et al. ....... 357/288 |
| 6,680,214 | B1 | * | 1/2004 | Tavkhelidze et al. .... 438/20 |

FOREIGN PATENT DOCUMENTS

AT    002 173 U1    6/1997

(Continued)

OTHER PUBLICATIONS

International Preliminary Examination Report from PCT/EP02/013398, dated Nov. 27, 2002.

(Continued)

*Primary Examiner*—Carl Whitehead, Jr.
*Assistant Examiner*—Monica D. Harrison
(74) *Attorney, Agent, or Firm*—Fish & Richardson P.C.

(57) ABSTRACT

A silicon substrate includes plural partial areas defined on the silicon substrate such that adjacent partial areas are orientated in different directions. The plural partial areas define an insulating layer that extends from a surface of the silicon subtrate into the silicon substrate. Each of the plural partial areas includes first regions that contain silicon dioxide formed by oxidation of silicon in the silicon substrate, and second regions that contain silicon dioxide deposited onto the silicon substrate. The first regions and the second regions are oriented in a substantially same direction and are arranged side-by-side and alternately such that two first regions do not border and two second regions do not border.

20 Claims, 2 Drawing Sheets

FOREIGN PATENT DOCUMENTS

| | | |
|---|---|---|
| JP | 60080244 | 5/1985 |
| JP | 03062946 | 3/1991 |
| JP | 05063069 | 3/1993 |
| JP | 2000077610 | 3/2000 |
| WO | WO97/45873 | 12/1997 |

OTHER PUBLICATIONS

H.B. Erzgraber "A Novel Buried Oxide Isolation for Monolithic RF Inductors on Silicon" XP-000859430; 1998 IEEE; pp. 535-539.

* cited by examiner

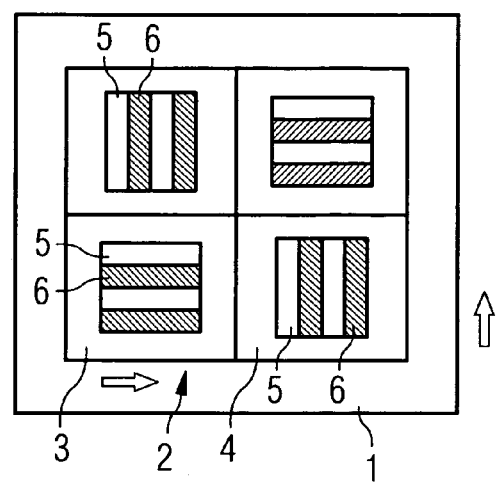
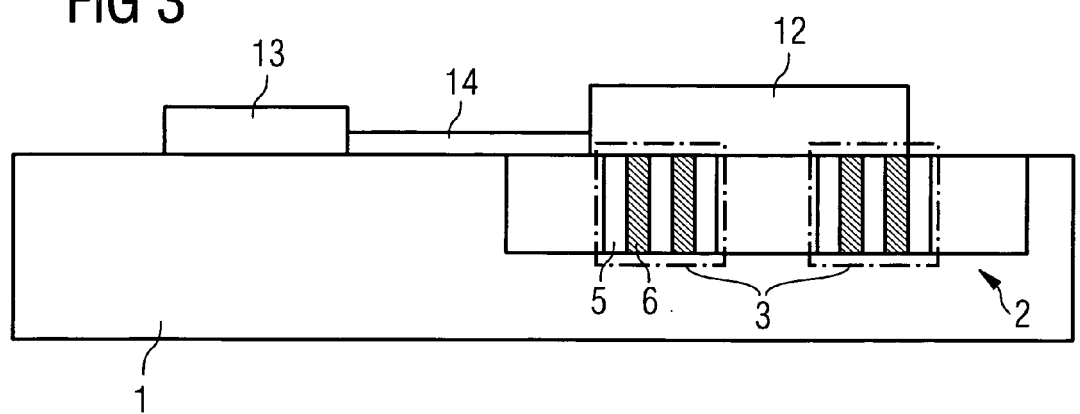

SILICON SUBSTRATE HAVING AN INSULATING LAYER

TECHNICAL FIELD

The present invention relates to a silicon substrate having an insulating layer, wherein the insulating layer has first regions that contain silicon dioxide that was formed by oxidation of the silicon out of the substrate, and wherein the substrate has second regions that contain silicon dioxide produced by deposition. The first and second regions extend along preferred directions. Furthermore, the invention relates to a silicon substrate for the production of the silicon substrate having an insulating layer. Furthermore, the invention relates to the arrangement of a silicon substrate having an insulating layer.

BACKGROUND

In the production of monolithic circuits, there is the need, as progress occurs in the direction of applications at higher and higher frequencies, to decouple passive circuit elements from the substrate. One way to guarantee such decoupling is to provide a sufficiently thick insulating layer between the circuit element and the substrate. Such an insulating layer is known from Erzgräber, Grabolls, Richter, Schley, and Wolf, "A Novel Buried Oxid Isolation for Monolithic RF Inductors on Silicon," IEEE 1998.

For the large area of semiconductor technology based on silicon, this means to implement the passive circuit elements such as conductive connections, resistors, capacitors, and inductors on an insulating layer that is on the same level as the silicon substrate, in other words with the active circuit elements. The great success of silicon semiconductor technology, in particular, is based on the possibility of converting silicon, which is a semiconductor, to a high-quality insulator, namely $SiO_2$, by means of a simple chemical oxidation step. In this way, active semiconductor elements that work insulated from one another can be integrated into electronic systems, at a high packing density, in an inexpensive manner. The chemical process of oxidation usually takes place at atmospheric pressure and at temperatures in the range of 800 to 1150° C. In this regard, the chemical conversion from Si to $SiO_2$ proceeds from the surface and progresses into the depth of the silicon substrate. The supply of oxygen to the front of the chemical reaction takes place via diffusion. Oxide that builds up hinders the diffusion process as it increases in depth; the oxidation speed decreases and becomes increasingly inefficient. Oxide layers such as those that are commonly produced in CMOS technology lie in the range of less than 1 μm. The circumstance that an increase in volume goes along with the conversion of Si to $SiO_2$ is of technological significance. Finally, the thickness of the $SiO_2$ layer that has formed measures approximately 2.2 times that of the silicon layer from which it was formed.

Geometric requirements with regard to monolithic integrated $SiO_2$ insulating layers are, on the one hand, their expanse into the depth, whereby an effective decoupling from the substrate is achieved at several μm to several 10 μm. On the other hand, lateral expanse values of up to several $mm^2$ are necessary, in order to be able to place passive components. For greater depth, trench structures are first produced in the silicon substrate, by means of an anisotropic etching process. Remaining silicon ridges can then be converted to oxide in the oxidation process, from all sides that are accessible to oxygen. If the ratio of the width of the ridge to the width of the etched gap is selected in such a manner that after oxidation, the interstices have been closed as a result of the volume increase, the desired effect of the thick insulating layer will have been achieved. However, real production processes cannot be controlled with a specific desired degree of accuracy. A certain distribution of the ridge width occurs over the work piece (silicon wafer) and over several work pieces, with the effect that either part of the gap remains open, or the ridge is not completely converted to oxide. For this reason, the ratio of ridge to gap is dimensioned, right from the start, in such a manner that after oxidation, a gap remains, which is then filled up, in a further process step, with oxide from a chemical vapor deposition. Differences in the thermal expansion coefficients between monocrystalline silicon and $SiO_2$ as well as the required process temperatures lead to mechanical stresses and therefore to warping of the geometry of the ridges. Thus, for example, ridges that were originally arranged to be parallel over long distances demonstrate cluster formation after oxidation, with ridges that are inclined towards one another. These clusters distinguish themselves from the adjacent cluster by a relatively wide gap. The latter gaps are too wide to be filled up by means of oxide deposition, and this is disadvantageous for the quality of the insulating layer that is formed.

SUMMARY

It is the task of the invention to provide a silicon substrate that has an insulating layer demonstrating improved properties. Furthermore, it is the task of the invention to provide a silicon substrate that allows the production of an insulating layer demonstrating improved properties.

These tasks are accomplished by means of a silicon substrate having an insulating layer, as recited in claim 1, as well as by means of a silicon substrate as recited in claim 4. Advantageous developments of the silicon substrate having an insulating layer as well as of the silicon substrate and the arrangement of a substrate having an insulating layer are found in the additional claims.

A silicon substrate having an insulating layer is provided, wherein the insulating layer is divided into partial areas. Furthermore, there are first regions that contain silicon dioxide formed by means of oxidation of silicon derived from the substrate, and extend along a preferred direction. Furthermore, there are second regions that contain silicon dioxide produced by means of deposition, and extend along a preferred direction. Each partial area contains at least two first and two second regions, which are arranged alternately next to one another, along a preferred direction of the partial area. A first type of partial area and a second type of partial area are present, whereby partial areas of the same type also have the same preferred direction, and whereby the preferred directions of the first type and the second type of partial areas are different from one another.

By means of dividing the insulating layer up into partial areas having different preferred directions, the result can be achieved that the insulating layer can be obtained without the risk of occurrence of warping in regions of the insulating layer. The formation of clusters of ridges that are inclined towards one another, with the problem of being unable to fill the correspondingly widened channels with deposited silicon dioxide can also be reduced. The risk of the formation of adjacent clusters having broad gaps can be reduced.

Accordingly, a silicon substrate is provided with which the silicon substrate having an insulating layer, as described above, can be produced. The silicon substrate is divided into partial areas. It has ridges separated from one another by means of channels, which run along preferred directions. Each partial region has at least two ridges that run along a preferred direction of the partial area. Furthermore, a first type of partial area and a second type of partial area are present, the preferred directions of which are different from one another.

In this regard, the partial areas that belong to one and the same type have preferred directions that run parallel to one another.

Furthermore, it is advantageous if the preferred directions of different types of partial areas are perpendicular to one another. In this way, the different types of partial areas can be clearly distinguished from one another, and this promotes the formation of a silicon dioxide layer that is homogeneous over the entire surface.

The partial areas can have essentially square outlines and be arranged in a checkerboard pattern. In this regard, a partial area of the first type and a partial area of the second type are arranged next to one another, alternately, in each instance along lines and gaps of the checkerboard pattern.

The checkerboard-like arrangement of the partial areas allows a structure of the subdivision of the silicon substrate, i.e., of the insulating layer in a silicon substrate that results from it, which is easy to produce.

Furthermore, in the case of a silicon substrate, the partial areas can be separated from one another by means of ridges that run along their outlines. At intersections of ridges, depressions are provided, which run from the corners, i.e. the edges of the adjacent channels, into the ridges of the intersections.

Such additional depressions have the advantage that the ridges can be made thinner at critical locations, where the silicon wall thickness to be oxidized would otherwise be increased due to intersections, and thereby very reliable oxidation of the ridge, in each instance, could be assured.

Furthermore, the additional depressions have the advantage that they counteract rounding effects that relate to the channels produced by means of photolithography, and which result in a rounding of the outer edges of the channels and thereby an additional reinforcement of the wall thickness of ridges in the region of intersections.

It is furthermore advantageous if a ridge that separates two partial areas from one another is narrower than the ridges that are arranged within the adjacent partial areas.

The ridges that separate two partial areas from one another are particularly affected by intersections of ridges, and for this reason it is particularly important to pay attention here to ensuring that the width of the ridge is not too great.

Furthermore, an arrangement of a substrate having an insulating layer is provided, wherein the insulating layer extends from the surface of the substrate towards the interior. A passive component is arranged on the surface of the insulating layer. An active component is arranged on the surface of the substrate, next to the insulating layer. The components are connected with one another in an electrically conductive manner, by means of a connecting element.

Such an arrangement has the advantage that good insulation of the passive component with regard to the semiconductive substrate as such, as well as with regard to other electrical components arranged on or in the substrate, is made possible by means of the insulating layer, which has good insulating properties and can be produced at a high quality.

In the following, the invention will be explained in greater detail, using exemplary embodiments and the related figures.

DESCRIPTION OF THE DRAWINGS

FIG. 2 shows a silicon substrate having an insulating layer, as an example, in a top view.

FIG. 3 shows an arrangement of a substrate having an insulating layer, as an example, in schematic cross-section.

DETAILED DESCRIPTION

Figure 1:
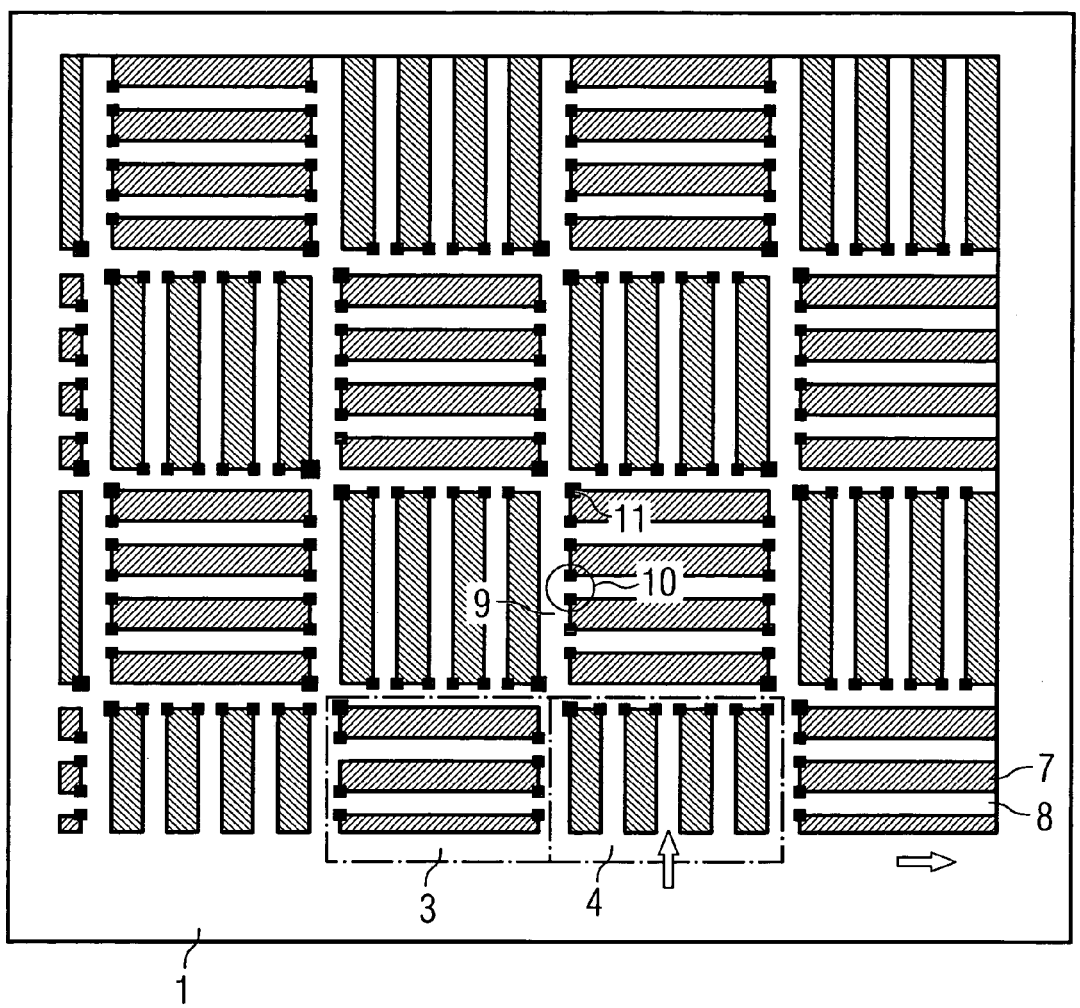
FIG. 1 shows a silicon substrate, as an example, in a top view.

FIG. 1 shows a silicon substrate 1 that is divided into partial areas 3, 4. Each partial area 3, 4 contains ridges 8 of Si that are separated from one another by channels 7. Within a partial area 3, 4, the ridges 8 run along a preferred direction (indicated by arrows) of the partial area 3, 4. There are partial areas 3 of the first type and there are partial areas 4 of the second type. The preferred directions of the partial areas 3 differ from the preferred directions of the partial areas 4. The preferred directions of the partial areas 3 are perpendicular to the preferred directions of the partial areas 4. The partial areas 3, 4 are implemented approximately in the shape of squares, which are distributed on the surface of the silicon substrate in a checkerboard pattern. The area covered by the checkerboard pattern can typically have an area of several square millimeters on the silicon substrate 1. The ridges 8 and the channels 7 have a width of preferably between 0.5 and 1.5 µm. The partial areas 3, 4 are separated from one another by means of ridges 9. In the regions of intersections 10 of ridges 8, 9, depressions 11 are provided, which extend from corners, i.e., edges of the channels 7 adjacent to the intersections 10 into the ridges 8 of the intersection 10. In this regard, the light fields of the checkerboard pattern correspond to the partial areas 4 of a second type. The ridge 9 that separates two partial areas 3, 4 from one another is made to be narrower than the ridges 8 within one of the partial areas 3, 4.

The silicon substrate according to FIG. 1 can be used to produce a silicon substrate having an insulating layer 2 according to FIG. 2. For this purpose, the silicon substrate 1 is thermally oxidized in a first step. In this process, the ridges 8, which consist of silicon, are oxidized by means of oxygen that is introduced from the outside. The ridges 8 are dimensioned in such a manner that after thermal oxidation, the channels 7 are not yet completely filled with oxide, and consequently residual channels remain. These residual channels are subsequently filled with silicon dioxide that was deposited in the gas phase.

Preferably, the silicon is converted to $SiO_2$.

Subsequently, a sintering step can still be used, which causes the deposited oxide to be compacted.

FIG. 2 shows a silicon substrate 1 having an insulating layer 2, which has been produced on the top of the silicon substrate 1. The insulating layer 2 is subdivided into partial areas 3 of a first type and partial areas 4 of a second type. In this regard, preferably, adjacent partial areas 3, 4 have different directions, which are perpendicular to one another (indicated with arrows). In each partial area 3, 4, first regions 5 and second regions 6 are present. The first regions 5 contain $SiO_2$ that has been formed by means of oxidation of silicon out of the substrate 1, and extend along the preferred direction of the partial area 3, 4, in each instance.

The second regions 6 contain $SiO_2$ that has been produced via deposition, and also extend along the preferred direction of the corresponding partial area 3, 4.

FIG. 3 shows the arrangement of a silicon substrate 1 having an insulating layer 2.

In this regard, the insulating layer 2 is shown in cross-section. First regions 5 alternate with second regions 6. This results in a line pattern that is formed via a cross-section into an insulating layer 2 according to FIG. 2. Areas having a line pattern of alternating adjacent first regions 5 and second regions 6 that lie next to one another result from a partial area 3 of the first type. Next to this first line pattern, after a relatively unstructured segment, there is a second line pattern, which again results from a partial area 3 of the first type. The unstructured segments arranged between the line patterns result from the other partial areas 4 of the second type, which are shown not in cross-section but rather in longitudinal section in FIG. 3. Because of the longitudinal section, there is no line structure. The insulating layer 2 extends from the top of the silicon substrate 1 into its depth. A passive component 12 is arranged on the surface of the insulating layer 2. A coil, for example, is a possible passive component 12.

Furthermore, an active component 13 is arranged on the surface of the silicon substrate 1, next to the insulating layer 2. A transistor, for example, is a possible active component 13. The active component 13 and the passive component 12 are connected with one another in electrically conductive manner by means of a connecting element 14. A track made of aluminum or polysilicon, for example, is a possible connecting element 14.

Because of the high-quality insulating layers 2 that are made possible by the invention, which are arranged in the form of islands in silicon substrates 1, passive components 12 to be arranged on the surface of the silicon substrate 1 can be well insulated with regard to active components 13.

The present invention is not limited to preferred directions of the first partial areas 3 and second partial areas 4, respectively, that are perpendicular to one another. Also, the invention is not restricted to square partial areas 3, 4.

The invention claimed is:

1. A silicon substrate comprising:
   plural partial areas defined on the silicon substrate such that adjacent partial areas are orientated in different directions, each of the plural partial areas comprising:
      first regions that contain silicon dioxide formed by oxidation of silicon in the silicon substrate; and
      second regions that contain silicon dioxide deposited onto the silicon substrate, the first regions and the second regions being oriented in a substantially same direction, the first regions and the second regions being arranged side-by-side and alternately such that two first regions do not border and two second regions do not border.

2. The silicon substrate of claim 1, wherein the adjacent partial areas are oriented perpendicularly to each other.

3. The silicon substrate of claim 1, wherein the plural partial areas are substantially square in shape and are arranged on the silicon substrate in a checkerboard pattern.

4. A silicon substrate comprising:
   plural partial areas defined on the silicon substrate such that adjacent partial areas are orientated in different directions, each of the plural partial areas comprising:
      silicon ridges, the silicon ridges comprising at least two silicon ridges that are oriented along a defined direction of a plural partial area; and
      channels that separate the silicon ridges and that are oriented in substantially a same direction as the silicon ridges.

5. The silicon substrate of claim 4, wherein the adjacent partial areas are oriented perpendicularly to each other.

6. The silicon substrate of claim 4, wherein the plural partial areas are substantially square in shape and are arranged on the silicon substrate in a checkerboard pattern.

7. The silicon substrate of claim 4, wherein each the plural partial areas further comprises:
   a separation ridge that separates a partial area from another partial area, the separation ridge running along at least part of a perimeter of the partial area; and
   a depression at an intersection of a silicon ridge and the separation ridge, the depression extending from an edge of a channel into the silicon ridge.

8. The silicon substrate of claim 7, wherein the separation ridge is narrower than the silicon ridges.

9. The silicon substrate of claim 4, wherein the silicon ridges contain oxidized silicon dioxide and the channels contain deposited silicon dioxide.

10. A silicon substrate comprising:
    plural partial areas defined on the silicon substrate such that adjacent partial areas are orientated in different directions, the plural partial areas defining an insulating layer that extends from a surface of the silicon substrate into the silicon substrate, each of the plural partial areas comprising:
       first regions that contain silicon dioxide formed by oxidation of silicon in the silicon substrate; and
       second regions that contain silicon dioxide deposited onto the silicon substrate, the first regions and the second regions being oriented in a substantially same direction, the first regions and the second regions being arranged side-by-side and alternately such that two first regions do not border and two second regions do not border;
    a passive component on a surface of the insulating layer;
    an active component on a surface of the silicon substrate that is next to the insulating layer; and
    a connecting element that connects the active component and the passive component.

11. The silicon substrate of claim 10, wherein the adjacent partial areas are oriented perpendicularly to each other.

12. The silicon substrate of claim 10, wherein the plural partial areas are substantially square in shape and are arranged on the silicon substrate in a checkerboard pattern.

13. A silicon substrate comprising:
    plural partial areas defined on the silicon substrate such that adjacent partial areas are orientated in different directions, the plural partial areas defining an insulating layer, each of the plural partial areas comprising:
       silicon ridges containing oxidized silicon dioxide; and
       channels containing deposited silicon dioxide, the channels separating the silicon ridges and being oriented in substantially a same direction as the silicon ridges;
    a passive component on a surface of the insulating layer;
    an active component on a surface of the silicon substrate that is next to the insulating layer; and
    a connecting element that connects the active component and the passive component.

14. The silicon substrate of claim 13, wherein the adjacent partial areas are oriented perpendicularly to each other.

15. The silicon of claim 13, wherein the plural partial areas are substantially square in shape and are arranged on the silicon substrate in a checkerboard pattern.

16. The silicon substrate of claim 13, wherein each the plural partial area further comprises:
    a separation ridge that separates a partial area from another partial area, the separation ridge running along at least part of a perimeter of the partial area; and a depression at an intersection of a silicon ridge and the separation ridge, the depression extending from an edge of a channel into the silicon ridge.

17. The silicon substrate of claim 16, wherein the separation ridge is narrower than the silicon ridges.

18. A silicon substrate comprising:
   plural partial areas defined on the silicon substrate such that adjacent partial areas are orientated in different directions, the silicon substrate comprising an insulating layer that extends from a surface of the silicon substrate to an interior of the silicon substrate, the insulating layer being divided into the plural partial areas;
   each of the plural partial areas comprising:
      first regions that contain silicon dioxide formed by oxidation of silicon in the silicon substrate; and
      second regions that contain silicon dioxide deposited onto the silicon substrate, the first regions and the second regions being oriented in a substantially same direction, the first regions and the second regions being arranged side-by-side and alternately such that two first regions do not border and two second regions do not border.

19. The silicon substrate of claim 18, wherein the adjacent partial areas are oriented perpendicularly to each other.

20. The silicon substrate of claim 18, wherein the plural partial areas are substantially square in shape and are arranged on the silicon substrate in a checkerboard pattern.

* * * * *